(12) United States Patent
Hansen

(10) Patent No.: US 9,615,274 B2
(45) Date of Patent: Apr. 4, 2017

(54) PLANE WAVE GENERATION WITHIN A SMALL VOLUME OF SPACE FOR EVALUATION OF WIRELESS DEVICES

(75) Inventor: Thorkild Hansen, Hopkinton, MA (US)

(73) Assignee: AZIMUTH SYSTEMS, INC., Acton, MA (US)

( * ) Notice: Subject to any disclaimer, the term of this patent is extended or adjusted under 35 U.S.C. 154(b) by 1152 days.

(21) Appl. No.: 13/569,518

(22) Filed: Aug. 8, 2012

(65) Prior Publication Data

US 2013/0052962 A1 Feb. 28, 2013

Related U.S. Application Data

(60) Provisional application No. 61/526,300, filed on Aug. 23, 2011.

(51) Int. Cl.
*H04B 17/00* (2015.01)
*H04W 24/08* (2009.01)
*G01R 29/10* (2006.01)
*G01R 29/08* (2006.01)

(52) U.S. Cl.
CPC ........ *H04W 24/08* (2013.01); *G01R 29/0871* (2013.01); *G01R 29/105* (2013.01); *G01R 29/0892* (2013.01)

(58) Field of Classification Search
CPC .............. G01R 29/0871; G01R 29/105; G01R 29/0892; G01R 29/0821; G01R 29/08; H04B 17/00; G01N 27/00
See application file for complete search history.

(56) References Cited

U.S. PATENT DOCUMENTS

| | | | | |
|---|---|---|---|---|
| 5,124,711 A | * | 6/1992 | Sorais | H01Q 21/245 342/361 |
| 5,485,156 A | * | 1/1996 | Manseur | G01S 7/02 342/77 |
| 5,581,264 A | * | 12/1996 | Tabata | H01Q 1/1271 343/704 |
| 5,585,803 A | * | 12/1996 | Miura | H01Q 3/26 342/157 |
| 5,889,825 A | * | 3/1999 | Schreib | H04B 17/20 375/231 |
| 5,912,646 A | * | 6/1999 | Seki | H01Q 21/28 343/700 MS |
| 6,031,498 A | * | 2/2000 | Issler | G01R 29/10 342/351 |

(Continued)

*Primary Examiner* — Pablo Tran
(74) *Attorney, Agent, or Firm* — Anderson Gorecki LLP

(57) ABSTRACT

Small anechoic chambers for evaluating a wireless device under test (DUT) are characterized by a set of antennas to which a test signal is applied and for which excitation coefficients are applied such that the test signal approximates a single plane wave or a preselected superposition of plane waves in the near field of the antennas. The test-equipment antennas in the chamber may be as close as one wavelength from the boundary of a test zone in which the DUT is disposed. Hence, the test zone can be in the near field of the test-equipment antennas and the test zone can be less than a wavelength from the chamber walls. Consequently, it is possible to perform tests in a small anechoic chamber that previously required a large anechoic chamber, e.g., advanced spatial channel-model tests and antenna-pattern measurements.

54 Claims, 11 Drawing Sheets

(56) References Cited

U.S. PATENT DOCUMENTS

| | | | | |
|---|---|---|---|---|
| 6,342,868 | B1* | 1/2002 | Tsai | H01Q 1/38 |
| | | | | 343/700 MS |
| 6,459,414 | B1* | 10/2002 | Levis | H01Q 1/38 |
| | | | | 343/780 |
| 7,286,961 | B2* | 10/2007 | Kildal | 702/182 |
| 7,555,294 | B2* | 6/2009 | Qi et al. | 455/425 |
| 8,682,638 | B2* | 3/2014 | Mlinarsky et al. | 703/23 |
| 8,793,093 | B2* | 7/2014 | Mow et al. | 702/108 |
| 2003/0139189 | A1* | 7/2003 | Alexander, Jr. | G01S 3/74 |
| | | | | 455/456.1 |
| 2005/0140556 | A1* | 6/2005 | Ohno et al. | 343/770 |
| 2010/0233969 | A1* | 9/2010 | Frolik et al. | 455/67.14 |
| 2011/0134001 | A1* | 6/2011 | Sakata | G01R 29/105 |
| | | | | 343/703 |
| 2011/0191090 | A1* | 8/2011 | Kyosti et al. | 703/13 |
| 2014/0241408 | A1* | 8/2014 | Sozanski et al. | 375/224 |
| 2015/0149108 | A1* | 5/2015 | Cozza | 702/124 |

* cited by examiner

Figure 3B
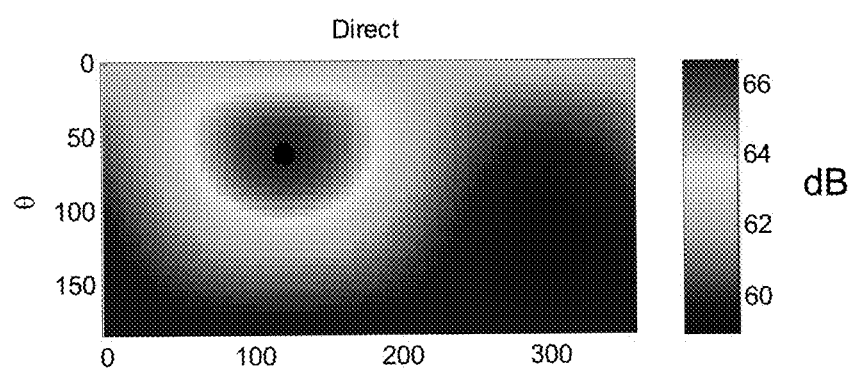
Figure 3C
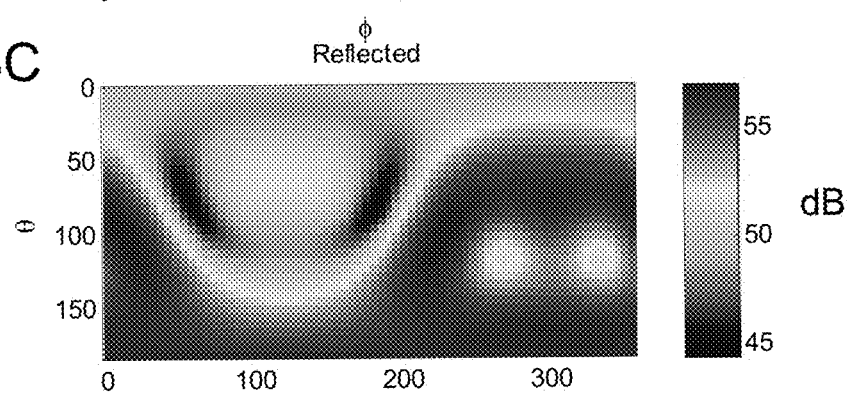
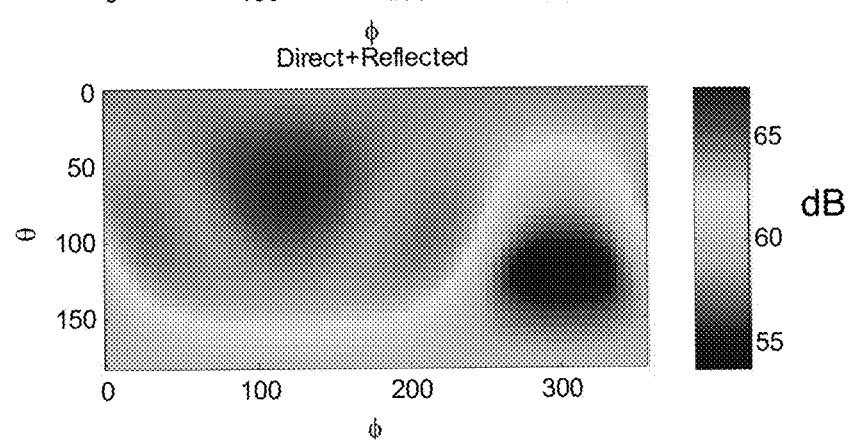
Figure 3D

PLANE WAVE GENERATION WITHIN A SMALL VOLUME OF SPACE FOR EVALUATION OF WIRELESS DEVICES

CROSS-REFERENCE TO RELATED APPLICATIONS

Priority is claimed to U.S. Provisional Patent Application 61/526,300 titled Small Anechoic Chamber for Evaluation of Wireless Devices, filed Aug. 23, 2011, which is incorporated by reference in its entirety.

BACKGROUND

The subject matter of this disclosure relates generally to one or more of plane-wave creation, anechoic chambers, spatial channel models, and over-the-air testing of wireless devices.

Anechoic chambers have been used for decades to evaluate antennas and wireless devices in a controlled environment. Channel models have been designed for use with test equipment to emulate real-world fading conditions in controlled environments. Typically the channel models are implemented in the anechoic chamber using a ring of test-equipment antennas that surround the device under test (DUT). In particular, channel emulators feed the test-equipment antennas to create the desired fading environment at the location of the DUT, which is sometimes referred to as the "test zone."

In the real world environment the DUT is rarely if ever located close to transmitters. Consequently, the field at the location of the DUT can be approximated well by a collection of propagating plane waves. Standard channel models prescribe that the field in the tests zone consist of propagating plane waves coming from specific directions. In order to achieve such a field in an anechoic chamber the distance between the test zone and the test-equipment antennas may have to be several wavelengths. As a consequence, the anechoic chamber is a large and expensive structure that may measure several meters across.

SUMMARY OF THE INVENTION

In accordance with one aspect an apparatus comprises: a plurality of antennas disposed in relation to a region of space; logic which calculates excitation coefficients which are applied to at least one signal provided to the antennas to approximate a single plane wave in the region; and transmission circuitry which applies the excitation coefficients to at least one signal transmitted via the antennas to generate the approximated single plane wave in the region.

In accordance with another aspect an apparatus comprises: a plurality of antennas disposed in relation to a region of space; and logic which records outputs due to a field transmitted from a device under test in the region, and creates a weighted sum of the recorded outputs and adjusts the weights such that a far field of the device under test is determined in a desired direction.

In accordance with another aspect a method comprises: calculating excitation coefficients for application to at least one signal provided to a plurality of antennas disposed in relation to a region of space to approximate a single plane wave in the region; and applying the excitation coefficients to at least one signal transmitted via the antennas to generate the approximated single plane wave in the region.

In accordance with another aspect a method comprises: using a plurality of antennas disposed in relation to a region of space, recording outputs of a field transmitted from a device under test in the region; creating a weighted sum of the recorded outputs; and adjusting weightings such that a far field of the device under test is determined in a desired direction.

In accordance with another aspect a computer program stored on a non-transitory computer-readable medium comprises: logic which calculates excitation coefficients which are applied to at least one signal provided to a plurality of antennas disposed in relation to a region of space to approximate a single plane wave in the region, and applies the excitation coefficients to at least one signal transmitted via the antennas to generate the approximated single plane wave in the region.

In accordance with another aspect a computer program stored on a non-transitory computer-readable medium comprises: logic which records, with of a set of antennas disposed in relation to a region of space, outputs due to a field transmitted from a device under test in the region, and creates a weighted sum of the recorded outputs and adjusts the weights such that a far field of the device under test is determined in a desired direction.

According to one aspect a method includes applying a set of excitation coefficients to a set of test-equipment antennas to create a total field. The method may also include selecting a region of space called the test zone, and adjusting the excitation coefficients such that the total field in the test zone is a single plane wave.

According to one aspect the test-equipment antennas are placed in an anechoic chamber. The excitation coefficients may be obtained from a least-squares solution. The test-equipment antennas may be placed on a closed surface. The magnitudes of the excitation coefficients may be reduced to obtain the total isotropic sensitivity of a device under test. The test-equipment antennas may be placed on a ring or a partial ring.

According to one aspect a method includes applying a set of excitation coefficients to a set of test-equipment antennas to create a total field. The method may also include selecting a region of space (sometimes referred to as the "test zone"), and adjusting the excitation coefficients such that the total field in the test zone is a preselected superposition of plane waves.

According to one aspect a method includes applying a set of time-varying excitation coefficients to a set of test-equipment antennas to create a total field. The method may also include selecting a region of space (test zone), and adjusting the excitation coefficients such that the total field in the test zone is a preselected superposition of fading plane waves.

In one aspect the test-equipment antenna are fed by a channel emulator. The channel emulator may produce a 2D channel model. The channel emulator may produce a multi-cluster channel model. The channel emulator may produce a single-cluster channel model. The channel emulator may produce an isotropic channel model.

According to one aspect a method includes recording the outputs of a set of test-equipment antennas. The method may also include computing a weighted sum of these outputs such that the farfield of a device under test is determined in a desired direction. In one aspect the weighted sum determines the total radiated power of the device under test.

An advantage associated with at least some aspects is the creation of user-specified propagating plane waves in a smaller anechoic chamber. For example, such plane waves might be created in a test zone that is in the near field of the test-equipment antennas. Current anechoic chambers typically require distances of greater than four wavelengths between test-equipment antennas and the test zone. Aspects associated with the present invention can enable operation at smaller distances, e.g., less than four, three or two wavelengths, and even at a distance of approximately one wavelength. Moreover, at least some aspects allow strong multiple interactions between the chamber walls and the test-equipment antennas. With the DUT placed in the test zone of a small anechoic chamber tests that would have previously required a large anechoic chamber may be performed. For example, total isotropic sensitivity (TIS) tests, total radiated power (TRP) tests, and throughput measurements using advanced spatial channel models such as described in CTIA—The Wireless Association, "Test Plan for Mobile Station Over the Air Performance Method of Measurement for Radiated RF Power and Receiver Performance," Revision Number 3.1, January 2011 can be performed.

The foregoing has outlined rather broadly some of the features and technical advantages of aspects of the present disclosure in order that the detailed description that follows may be better understood. Additional features and advantages of the disclosure will be described hereinafter. However it should be appreciated by those skilled in the art that the conception and aspects disclosed may be readily utilized as a basis for modifying or designing other structures, e.g., for carrying out the same purposes of the present disclosure or entirely different purposes. It should also be realized by those skilled in the art that such modifications and structures do not depart from the spirit and scope of the disclosure, and that the invention is not to be interpreted as being limited except as set forth in the appended claims. Novel features which are believed to be characteristic of the disclosure together with further objects and advantages will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE FIGURES

FIGS. 3B, 3C and 3D illustrate the direct, reflected, and total fields on the observation sphere of FIG. 3A, wherein the parameter values are $\sigma_w=0.01$ S/m, $\in_w=3\in$, Refl=−11 dB, Frequency=700 MHz, $R_w=0.41$ m, $R_d=0.34$ m, and $R_{test}=0.15$ m.

DETAILED DESCRIPTION

Creating a Single Plane Wave in the Near Field of Antennas and Scatterers

Figure 1:
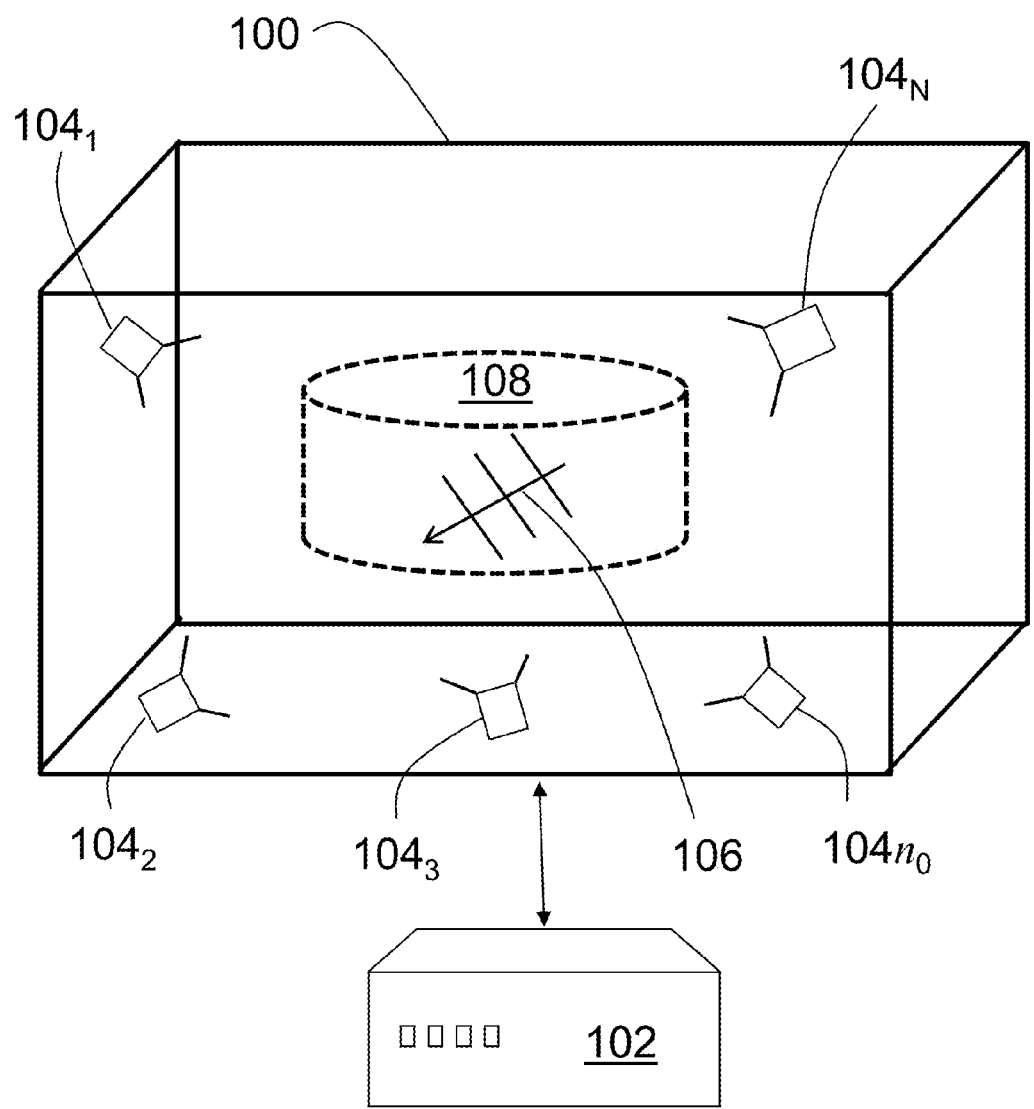
FIG. 1 illustrates a wireless test system including an anechoic chamber and channel emulator.

FIG. 1 illustrates a wireless test system including an anechoic chamber 100 and channel emulator 102. The anechoic chamber includes walls which are absorbing but not perfectly absorbing, so a field produced by N antennas $104_1$, $104_2$, $104_3$ . . . $104_N$ disposed in the chamber is scattered by the walls. Also, a field produced by one antenna will scatter off all the other antennas. The channel emulator includes computer programs stored on non-transitory computer-readable media and processing hardware for creating, modifying, amplifying and otherwise generating signals that are provided to the antennas for transmission. In one aspect each of the antennas is fed by a time-harmonic signal with complex amplitude $a_n$, with n=1, 2, . . . , N, in order to present a single plane wave 106 in a test zone 108 in the anechoic chamber. The single plane wave may be used to test a wireless device under test (DUT) disposed in the test zone, e.g., by emulating real-world fading conditions, in a chamber of smaller volume than was previously required.

Logic associated with the channel emulator 102, which may include computer programs and processors, calculates excitation coefficients to approximate the single plane wave in the near field of the antennas and scatterers in the test zone. If the system broadcasts with an antenna 104 $n_0$ at a single frequency ($e^{-i\omega t}$ time dependence suppressed) with a unit input signal and all other antennas are terminated in matched loads then $a_n=\delta_{nn_0}$ with $\delta_{pq}=1$ for p=q and $\delta_{pq}=0$ for p≠q. The total electric and magnetic fields in this situation can be denoted $E_n(r)$ and $H_n(r)$. These fields include the direct field radiated by the antenna and all reflected fields caused by chamber walls and the other antennas. Also, $E_n(r)$ and $H_n(r)$ include multiple interactions between the scatterers (walls and antennas) present in the chamber. Let $E^{pw}(r, \hat{k})$ and $H^{pw}(r, \hat{k})$ be the electric and magnetic fields of the desired propagating plane wave to be created in the test zone. Here $\hat{k}$ is a unit vector pointing in the propagation direction of the plane wave, so that $\hat{k} \cdot E^{pw}(r, \hat{k})=0, \hat{k} \cdot H^{pw}(r, \hat{k})=0$, and $H^{pw}(r, \hat{k})=-\sqrt{\mu/\in}\hat{k} \times E^{pw}(r, \hat{k})$, where $\in$ and $\mu$ are the permittivity and permeability of free space, respectively (See T. B. Hansen and A. D. Yaghjian, *Plane-Wave Theory of Time-Domain Fields*, New York: IEEE Press, 1999 at ch. 3). The electric and magnetic fields can then be written explicitly as $E^{pw}(r, \hat{k})=E^0 e^{ik\hat{k} \cdot r}$ and $H^{pw}(r, \hat{k})=-\sqrt{\mu/\in}\hat{k} \times E^0 e^{ik\hat{k} \cdot r}$, where $E^0$ is a constant vector that equals the electric field of the plane wave at the origin. Introducing a set of points $r_j$, j=1, 2, . . . , J in the test zone (or on its boundary) at which the plane-wave conditions are imposed $$E^0 e^{ik\hat{k} \cdot r_j} = \sum_{n=1}^{N} a_n E_n(r_j)$$

and $$\hat{k} \times E^0 e^{ik\hat{k}\cdot r_j} = -\sqrt{\frac{\varepsilon}{\mu}} \sum_{n=1}^{N} a_n H_n(r_j),$$

each of these two equations contain three rectangular components, thereby yielding 6J equations for determining the N unknown excitation coefficients $\alpha_n$. Typically, N<<J.

In accordance with one aspect an approximation such as a minimum-error solution is utilized. An example is the least-squares solution $\alpha_n$, which minimizes the error $$\varepsilon = \sum_{j=1}^{J} \left[ \left| E^0 e^{ik\hat{k}\cdot r_j} - \sum_{n=1}^{N} a_n E_n(r_j) \right|^2 + \left| \hat{k} \times E^0 e^{ik\hat{k}\cdot r_j} + \sqrt{\frac{\varepsilon}{\mu}} \sum_{n=1}^{N} a_n H_n(r_j) \right|^2 \right].$$

To represent the explicit solution $\alpha_n$ the column vector P of length 6J which contains the rectangular components of the plane-wave fields $E^0 e^{ik\hat{k}\cdot r_j}$ and $\hat{k} \times E^0 e^{ik\hat{k}\cdot r_j}$ is introduced. Also introduced is the column vector A of length N which contains the unknown excitation coefficients $\alpha_n$. Also introduced is the 6J×N matrix $\overline{M}$ which contains the rectangular components of $E_n(r_j)$ and $-\sqrt{\varepsilon/\mu}H_n(r_j)$. Hence, the plane-wave conditions can be expressed as the single matrix equation $$P = \overline{M} A$$

so that the least-squares solution is determined from the square matrix equation $$\overline{M}^H P = [\overline{M}^H \overline{M}] A$$

where $\overline{M}^H$ is the transpose complex conjugate of $\overline{M}$. The least-squares solution can then be expressed explicitly as $$A = [\overline{M}^H \overline{M}]^{-1} \overline{M}^H P$$

where $[\overline{M}^H \overline{M}]^{-1}$ is the inverse of $[\overline{M}^H \overline{M}]$. Note that although both the electric and magnetic fields are included in this calculation of the excitation coefficients it is possible to rely on measurements of the electric field only.

Exact Plane-Wave Solutions

Let the points $r_j$ form a closed surface like a sphere. If coefficients $\alpha_n$ can be determined such that equation $P = \overline{M}A$ is satisfied exactly, then $E^{pw}(r, \hat{k}) = \sum_{n=1}^{N} a_n E_n(r_j)$ and $H^{pw}(r, \hat{k}) = \sum_{n=1}^{N} a_n H_n(r_j)$ everywhere inside the closed surface. This follows from the fact that the field inside a source-free closed surface is determined uniquely from its tangential components on the closed surface (See T. B. Hansen and A. D. Yaghjian, *Plane-Wave Theory of Time-Domain Fields*, New York: IEEE Press, 1999 at ch. 2). This example indicates that it may only be necessary to impose the plane-wave condition at the boundary of the test zone in order to produce an accurate plane wave inside the test zone. Further, for a spherical test zone it is only necessary to impose the plane-wave condition on either the electric field or the magnetic field because the field inside a source-free sphere is uniquely determined by either the tangential electric or magnetic field. The same is true for a circular cylindrical test zone provided the cylinder is sufficiently long (tall).

Hertzian Dipoles in Free Space

Another special case is where the test-equipment antennas are Hertzian dipoles. The electric field of a Hertzian dipole with current $J(r) = p\delta(r-r')$, where p is a constant vector, is (See T. B. Hansen and A. D. Yaghjian, Supra.)

$$E(r) = i\omega\mu p \cdot \overline{G}(r,r')$$

where $$\overline{G}(r, r') = \frac{e^{ikR}}{4\pi ikR^2} \left[ (\overline{I} - \hat{R}\hat{R})ikR - (\overline{I} - 3\hat{R}\hat{R})\left(1 - \frac{1}{ikR}\right) \right]$$

is the free-space dyadic Green's function and $R = r - r'$, $R = |R|$, $\hat{R} = R/R$, and $\overline{I}$ is the identity dyadic. The dipole points in the direction p and is located at r'. Its field is evaluated at r, and $$E(r) = i\omega\mu \frac{e^{ikR}}{4\pi ikR^2} \left[ (p - p\cdot\hat{R}\hat{R})ikR - (p - 3p\cdot\hat{R}\hat{R})\left(1 - \frac{1}{ikR}\right) \right]$$

which shows that the dipole field has terms of the form $R^{-q}$ with q=1, 2, 3. It is not apparent that a collection of dipoles with the complicated near fields can combine to produce a high-quality plane wave in their immediate vicinity (the distance from dipoles to the plane-wave zone should be at least one wave length to reduce the effect of multiple interactions). However, the following numerical examples demonstrate that such a plane wave can indeed be created, even when the dipoles are in a confined space with wall reflections adding to the field in the test zone.

Hertzian Dipoles in Spherical Cavity

Figure 2:
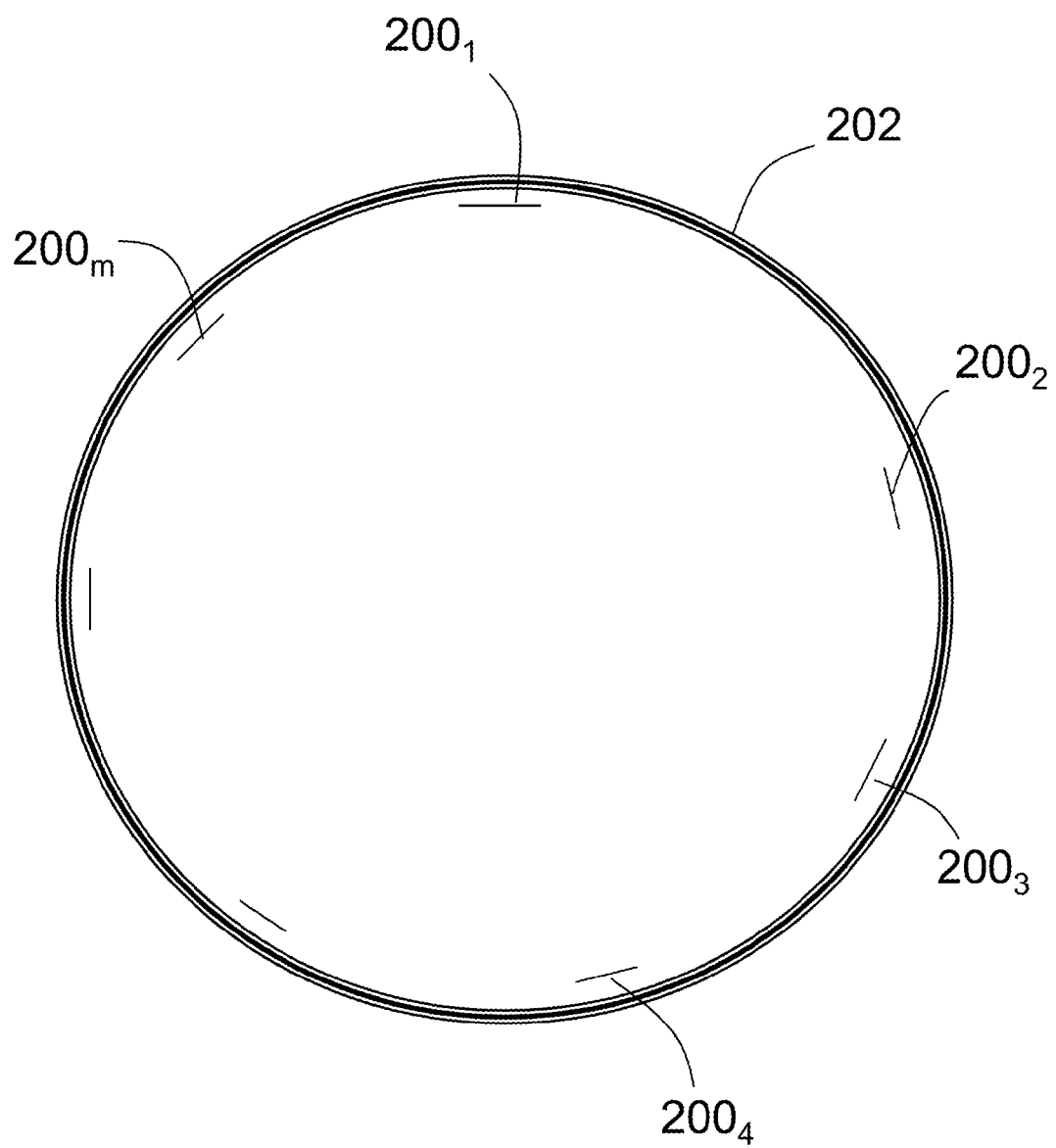
FIG. 2 illustrates a spherical cavity with absorbing walls containing transmitting dipole antennas, and wherein a single plane wave is created in the test zone.

FIG. 2 illustrates a collection of dipoles $200_1$, $200_2$, $200_3 \ldots 200_m$ in a spherical cavity 202 with reflecting walls given by $r = R_w$, where r is the radial distance in a spherical coordinate system centered on a cavity defined by the walls. The walls (the region $r > R_w$) are formed of a dielectric material with permittivity $\in_w$ and conductivity $\sigma_w$.

Figure 3A:
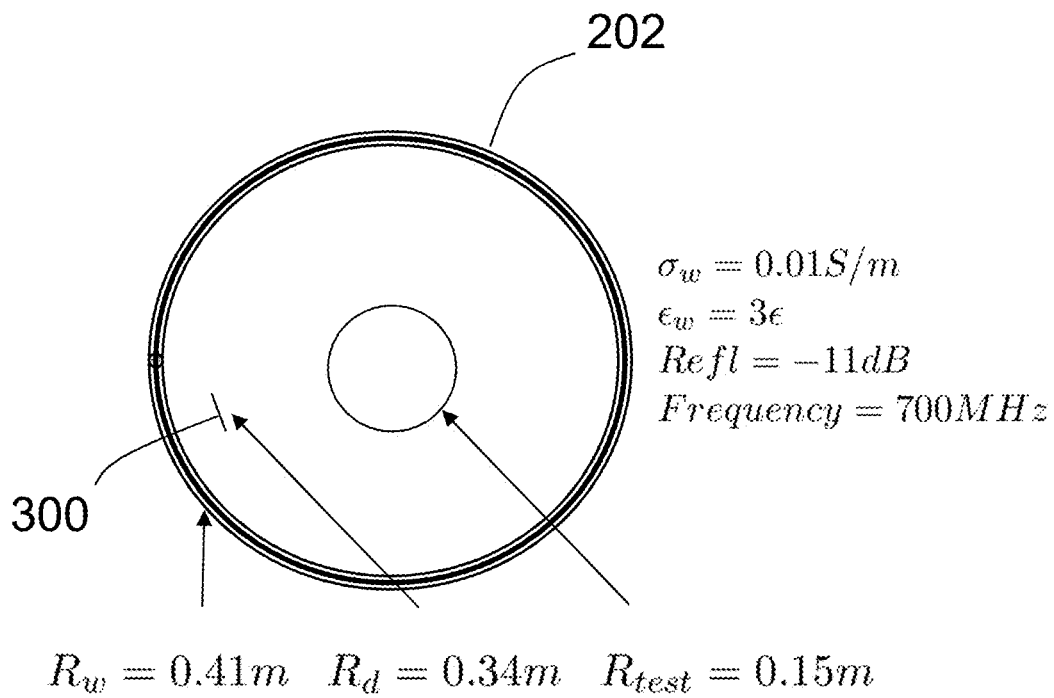
FIG. 3A illustrates a single dipole transmitting in a spherical cavity.

Referring to FIG. 3, it is possible to compute the exact field in the spherical cavity due to a transmitting dipole 300 by use of spherical wave expansions. If the transmitting dipole is at a radius $r = R_d < R_w$, three characteristic regions are defined: (i) the wall region $r > R_w$ where only outgoing spherical waves exist, (ii) the region $R_w > r > R_d$ between the dipole and the wall where both outgoing and standing spherical waves exist, and (iii) the inner region $r < Rd$ where only a standing spherical wave exists. All expansions are performed with W. W. Hansen's vector-wave functions (see W. W. Hansen, "A new type of expansion in radiation problems," *Physical Review*, Vol. 47, pp. 139-143, January 1935 and J. A. Stratton, *Electromagnetic Theory*, New York: McGraw-Hill, 1941). The unknown expansion coefficients are determined by imposing the condition that the tangential components of both the electric and magnetic fields be continuous across the wall boundary $r = R_w$.

The total field in the cavity with one dipole transmitting equals the direct dipole field plus the field reflected by the walls (since an exact solution is used, this includes all multiple interactions between the wall surfaces). FIGS. 3B, 3C and 3D respectively show the associated direct, reflected, and total field on the boundary of a spherical test zone with radius 0.15 m (all three rectangular field components are included) as functions of spherical angles $(\theta, \phi)$. The transmitting frequency is 700 MHz and the wall is made of absorbing material with parameters $\sigma_w = 0.01$ S/m and $\in_w = 3\in$, resulting in a planar reflection coefficient of Refl=-11 dB. Hence, if a normally incident plane wave illuminates a half space filled with this material, the reflected plane wave would have a magnitude that is 11 dB below the magnitude of the incident plane wave. The chamber has inner radius 0.41 m, the transmitting dipole is 0.34 m away from the chamber center, and the test zone has radius 0.15 m. The wavelength is 0.42 m. Note that the direct field is strongest at the point of the test surface that is closest to the dipole. The reflected field has a more complicated shape due to the multi-bounce reflections at the walls. The total field is different from the direct field, indicating that wall reflections should indeed be taken into account when the plane-wave least-squares solution is computed.

Figure 4A:
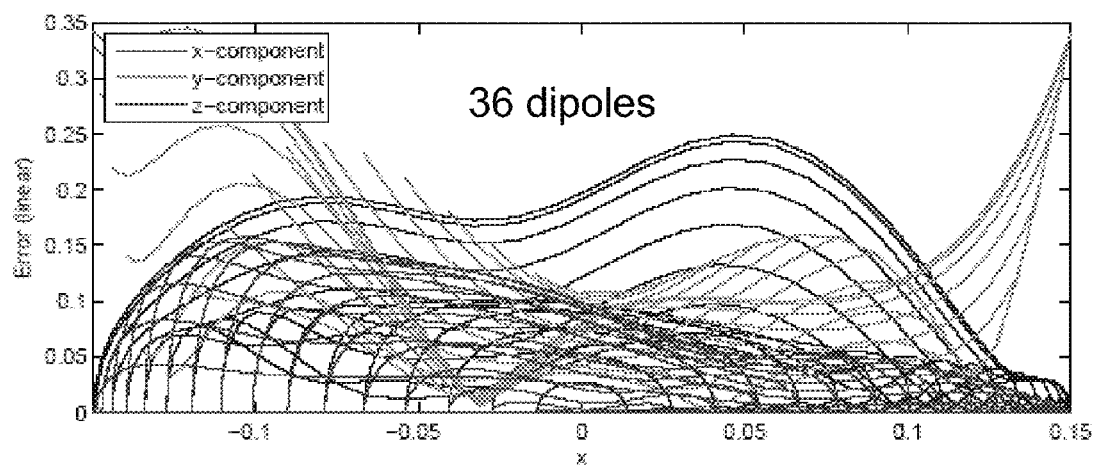
FIGS. 4A, 4B and 4C illustrate the difference between the rectangular components of the desired plane wave on the surface of the test zone and the approximate plane waves obtained with 36, 84, and 248 dipoles, respectively. The differences are plotted as functions of x. The magnitude of the desired plane wave is 1, so a difference value of 0.02 corresponds to a 2% error. The parameter values are $\sigma_w=0.01$ S/m, $\in_w=3\in$, Refl=−11 dB, Frequency=700 MHz, $R_w=0.43$ m, $R_d=0.33$ m, $R_{test}=0.15$ m.
Figure 4B:
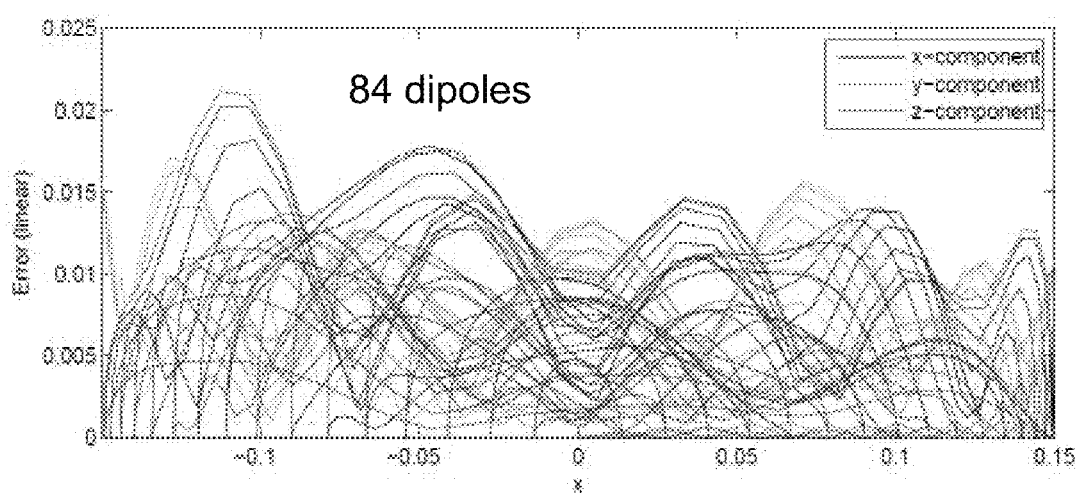
Figure 4C:
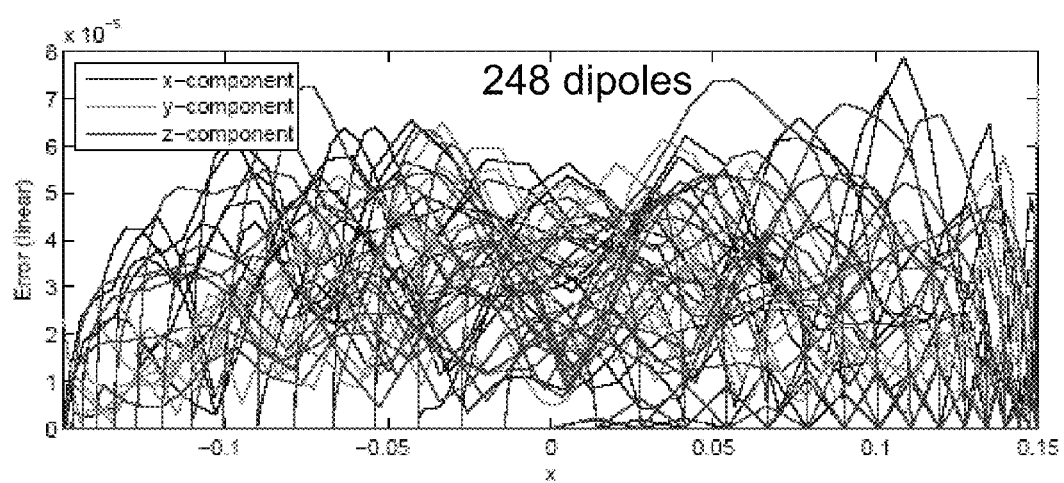

FIGS. 4A, 4B and 4C respectively illustrate examples in which 36, 84, and 248 dipoles are evenly distributed on a spherical surface in the chamber. The dipoles are tangential to the spherical cavity wall and appear as crossed pairs (for example, different 18 dipole location in the case of 36 dipoles). The total field of each dipole fed by a unit-amplitude signal is computed at the boundary of the test zone (with all other dipoles turned off). This yields the matrix $\overline{\overline{M}}$. The next step is to select a desired plane wave to get the vector P and compute the least-squares excitation coefficients for each dipole. FIGS. 4A, 4B and 4C show differences between the rectangular components of the desired plane wave on the surface of the test zone and the approximate plane waves obtained with 36, 84, and 248 dipoles. The differences are plotted as functions of x (the test zone radius is 0.15 m so x goes from −0.15 to +0.15 m). The desired plane wave propagates in the x direction with electric field given by $E^{pw}(r) = \hat{y}\, e^{ikx}$. A difference of 0.02 thus corresponds to a 2% error. The parameter values are $\sigma_w = 0.01$ S/m, $\epsilon_w = 3\epsilon$, Refl=−11 dB, Frequency=700 MHz, $R_w = 0.43$ m, $R_d = 0.33$ m, $R_{test} = 0.15$ m. The maximum errors are 0.35, 0.022, and $8 \cdot 10^{-5}$ in the case of 36, 84, and 248 dipoles, respectively. Consequently, about 84 dipoles are needed to create a plane wave with arbitrary direction of propagation for this spherical cavity. A typical DUT would likely not be able to distinguish between the plane waves created with 84 dipoles (resulting in 2% max error) and 248 dipoles (resulting in 0.008% max error).

Hertzian Dipoles on a Partial Ring

Figure 5:
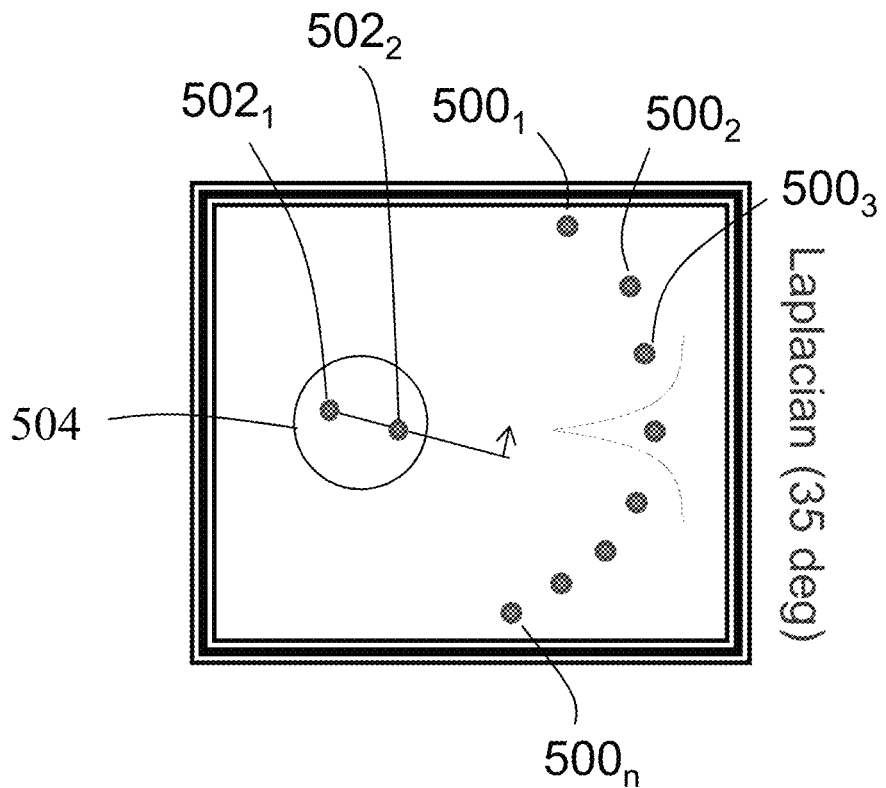
FIG. 5 illustrates eight vertical transmitting dipoles placed on a circular arc in an anechoic chamber as seen from above. The DUT has two vertical receiving dipoles that are rotated around the common midpoint. The array arc is 44°, the array radius is 2.52 wavelengths, the distance between receiving dipoles is 2 wavelengths, and the test zone radius is 1.02 wavelengths. The chamber dimensions are 16 wavelengths by 5.6 wavelengths by 5.6 wavelengths. The Laplacian parameter value is $\sigma=35°$.

FIG. 5 illustrates a simpler numerical example in which an array of vertical dipole test-equipment antennas $500_1$, $500_2$, $500_3$ ... $500_n$ are arranged in a partial ring (circular arc). A DUT disposed within a test zone 504 includes two vertical receiving dipoles $502_1$, $502_2$ that are rotated around the common midpoint. The array arc is 44°, the array radius is 2.52 wavelengths, the distance between receiving dipoles is 2 wavelengths, and the test zone radius is 1.02 wavelengths. The chamber dimensions are 16 wavelengths by 5.6 wavelengths by 5.6 wavelengths. The planar reflection coefficient of the wall is again Refl=−11 dB. The numerical example is at 2.4 GHz corresponding to a wavelength of 12.5 cm.

Figure 6:
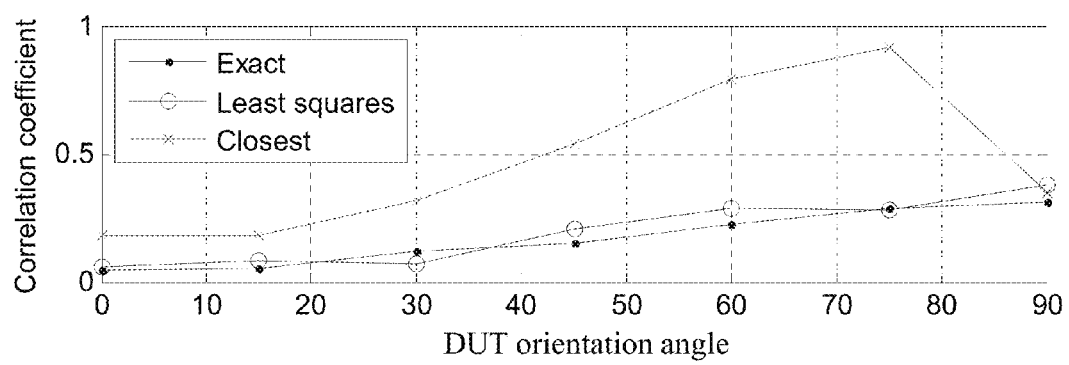
FIG. 6 illustrates correlation coefficients of DUT antenna output as function of DUT orientation.

Referring to FIGS. 5 and 6, the DUT is illuminated by plane waves with directions of incidence distributed according to the Laplacian $e^{-|\phi|/\sigma}/(2\sigma)$ with parameter value $\sigma = 35°$. For each angular position of the DUT it is possible to compute the following: (i) the exact correlation between the outputs of the two receiving dipole antennas if they were illuminated by plane waves with directions of incidence following the Laplacian (this result is labeled "exact"), (ii) the correlation between the outputs of the two receiving dipole antennas if they were illuminated by the approximate plane wave obtained from the least-squares approach (this result is labeled "least squares"), and (iii) the correlation between the outputs of the two receiving dipole antennas if they were illuminated by the test-equipment dipole that is closest to the exact direction of incidence (this result is labeled "closest"). The results are shown in FIG. 6. Note that the least-squares values are in good agreement with the exact values.

Experimental Calibration Procedure

The excitation coefficients $a_n$ can be determined from recorded values of the fields on a surface in the actual chamber. As in the numerical examples, only one antenna transmits at a time. In one implementation the electric field on a surface surrounding the test zone is measured with a small electric dipole whose output is approximately equal to a component of the electric field. This measurement could be repeated with the dipole in different orientations. Also, the output on several concentric surfaces surrounding the test zone can be recorded. The least squares solution is flexible and can use as input one or more of the rectangular components of the electric field, regardless of the shape of the scanning surface.

Multiple Interactions Between DUT and Chamber

Multiple interactions between the DUT and chamber (including test-equipment antennas) can also be considered. The procedure outlined above can in principle lead to the creation of a single plane wave of arbitrarily high quality. This pristine plane wave is generated for the case where the test zone is free space and all radiated fields are generated by chamber walls and test-equipment antennas (and multiple interactions between these). When a DUT is placed in the test zone it scatters the incoming plane wave and thus creates an outgoing spherical wave that propagates towards the walls of the chamber. This outgoing wave causes no problems by itself. However, the outgoing wave scatters off both the walls and the test-equipment antennas to create an incoming secondary wave that distorts the original plane wave. Hence, it is generally desirable that the chamber be as anechoic as practical to help ensure that the secondary incoming waves do not compromise the quality of the original plane wave. Also, the test-equipment antennas might be placed about one wavelength from the DUT.

It is also possible with the spherical-wave theory to compute multiple interactions between DUT and chamber by adding a scattering sphere (the DUT model) at the center of the spherical cavity. This simulation could estimate the significance of the multiple interactions and the maximum allowable reflectivity level of the chamber walls.

Transmitting DUT

In the description above the test-equipment antennas transmit and the DUT receives. Due to the principle of reciprocity, the principles work equally well when the DUT transmits and the test-equipment antennas receive. To explain this mode of operation, assume that the excitation coefficients $a_n$ cause the test-equipment antennas to produce the plane-wave field $E^{pw}(r, \hat{k}) = E^0 e^{ik\hat{k}\cdot r}$. Now let the DUT transmit and the test-equipment antennas receive. Let $V_n$ be the outputs of the test-equipment antennas in this situation. Then the component parallel to $E^0$ of the DUT far field in the direction $-\hat{k}$ can be determined from $\sum_{n=1}^{N} V_n a_n$. By changing $a_n$ it is possible to determine the entire far-field pattern of the DUT.

Flow Charts

Figure 7:
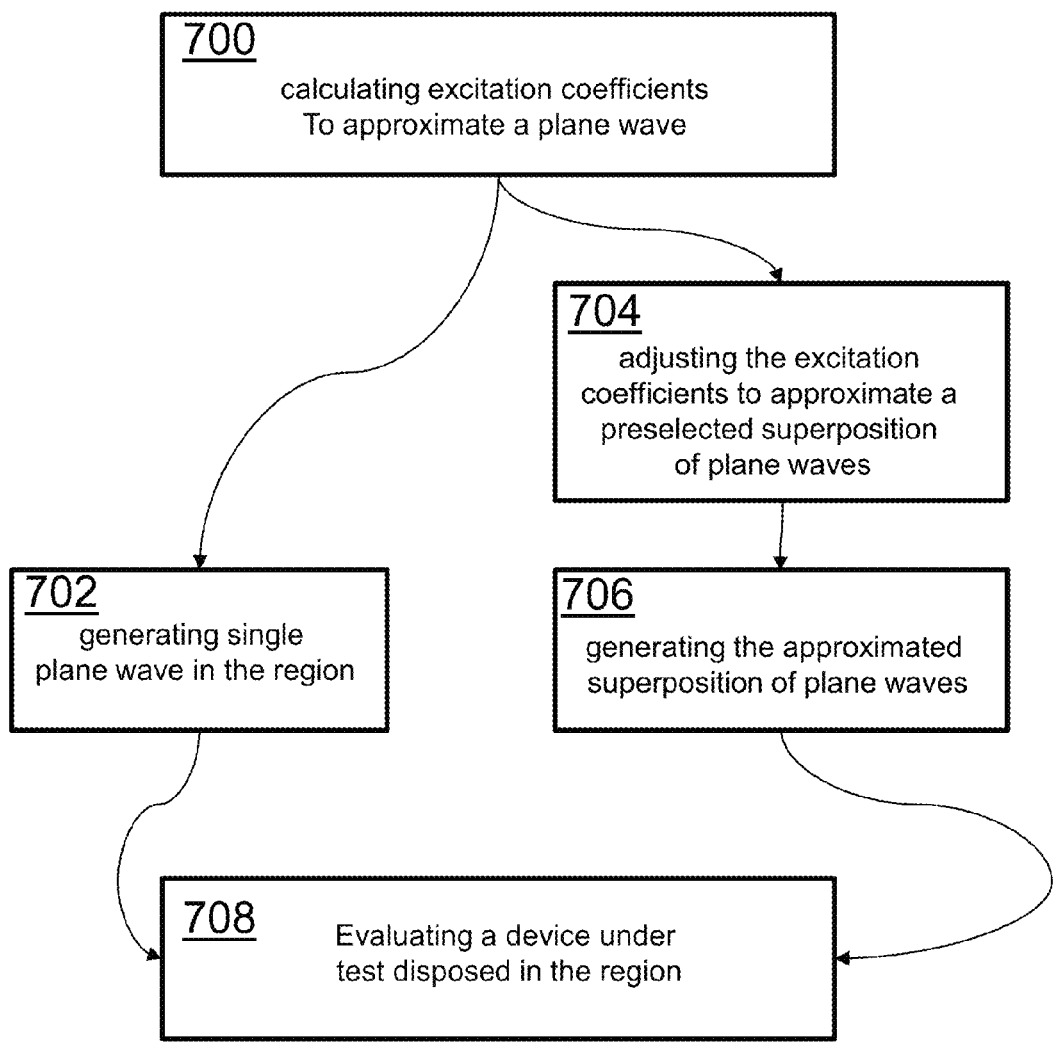
FIGS. 7 and 8 illustrate methods associated with aspects described with respect to the other figures.

FIG. 7 illustrates a method in accordance with principles described above. An initial step 700 is calculating excitation coefficients to approximate a plane wave. Depending on what type of result is desired the next step may be generating a single plane wave in the designated region (step 702). Alternatively the next step may be adjusting the excitation coefficients to approximate a preselected superposition of plane waves (step 704), in which case the approximated superposition of plane waves is then generated in step 706. In either case the plane wave or waves are used to evaluate a device under test disposed in the region in step 708.

Figure 8:
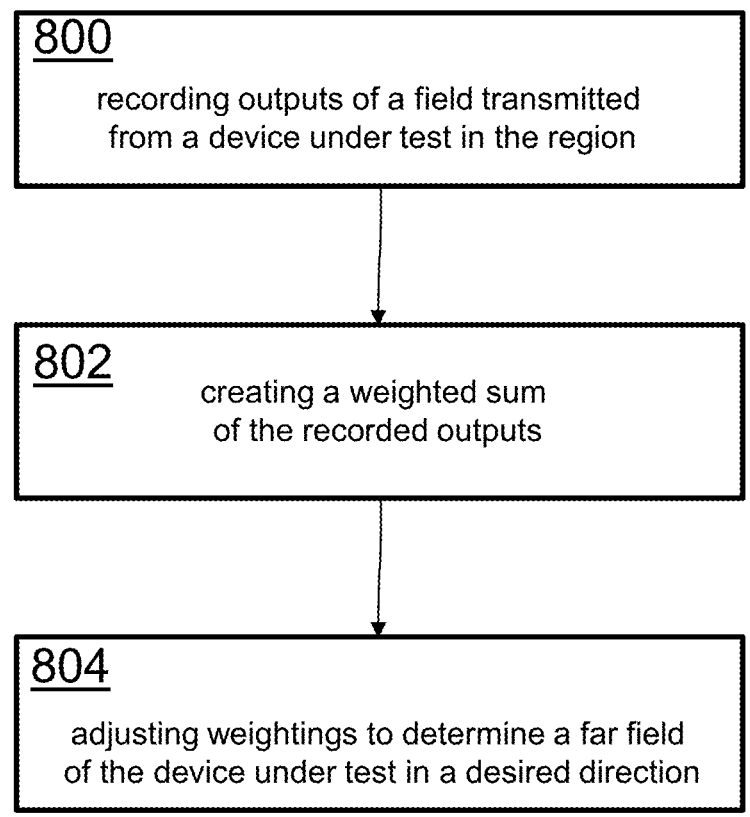

FIG. 8 illustrates another method in accordance with principles described above. An initial step 800 includes recording, at different antennas, outputs of a field transmitted from a device under test disposed in a test zone region. The next step 802 is creating a weighted sum of the recorded outputs. The weightings are then adjusted to determine a far field of the device under test in a desired direction in step 804.

While the invention is described through the above exemplary embodiments, it will be understood by those of ordinary skill in the art that modification to and variation of the illustrated embodiments may be made without departing from the inventive concepts herein disclosed. Moreover, while the preferred embodiments are described in connection with various illustrative structures, one skilled in the art will recognize that the system may be embodied using a variety of specific structures. Accordingly, the invention should not be viewed as limited except by the scope and spirit of the appended claims.

What is claimed is:

1. An apparatus comprising:
   a plurality of antennas disposed in relation to a region of space such that the region is in a near field of the plurality of antennas;
   logic which calculates excitation coefficients which are applied to at least one signal provided to the antennas to approximate a single plane wave in the region; and
   transmission circuitry which applies the excitation coefficients to at least one signal transmitted via the antennas to generate the approximated single plane wave in the region.

2. The apparatus of claim 1 wherein the antennas are disposed on a closed surface.

3. The apparatus of claim 1 including an anechoic chamber in which the region and antennas are located.

4. The apparatus of claim 1 wherein the antennas are disposed along an arc.

5. The apparatus of claim 1 wherein the antennas are disposed along a ring.

6. The apparatus of claim 1 wherein the antennas include a set of dipoles.

7. The apparatus of claim 1 wherein the logic calculates multiple sets of excitation coefficients to sequentially produce plane waves from a plurality of directions.

8. The apparatus of claim 7 further comprising logic which evaluates total isotropic sensitivity of a device under test disposed in the region.

9. The apparatus of claim 1 wherein the logic adjusts the excitation coefficients to approximate a preselected superposition of plane waves which is then generated by the transmission circuitry.

10. The apparatus of claim 1 wherein the logic uses measured data to calculate the excitation coefficients.

11. The apparatus of claim 1 wherein the logic uses simulated data to obtain the excitation coefficients.

12. The apparatus of claim 1 wherein the logic uses a least-squares solution to obtain the excitation coefficients.

13. The apparatus of claim 1 wherein the transmission circuitry applies time-varying excitation coefficients to create faded channel conditions in the region.

14. The apparatus of claim 1 further comprising a channel emulator.

15. The apparatus of claim 14 wherein the channel emulator utilizes a 2D channel model.

16. The apparatus of claim 14 wherein the channel emulator utilizes a multi-cluster channel model.

17. The apparatus of claim 14 wherein the channel emulator utilizes a single-cluster channel model.

18. The apparatus of claim 14 wherein the channel emulator utilizes an isotropic channel model.

19. A method comprising:
   calculating excitation coefficients for application to at least one signal provided to a plurality of antennas disposed in relation to a region of space such that the region is in a near field of the plurality of antennas to approximate a single plane wave in the region; and
   applying the excitation coefficients to at least one signal transmitted via the antennas to generate the approximated single plane wave in the region.

20. The method of claim 19 including arranging the antennas on a closed surface.

21. The method of claim 19 including locating the region and the antennas within an anechoic chamber.

22. The method of claim 19 including arranging the antennas along an arc.

23. The method of claim 19 including arranging the antennas along a ring.

24. The method of claim 19 including utilizing a set of dipoles as the antennas.

25. The method of claim 19 including calculating multiple sets of excitation coefficients to sequentially produce plane waves from a plurality of directions.

26. The method of claim 25 including evaluating total isotropic sensitivity of a device under test disposed in the region.

27. The method of claim 19 including adjusting the excitation coefficients to approximate a preselected superposition of plane waves and generating the approximated superposition of plane waves.

28. The method of claim 19 including using measured data to calculate the excitation coefficients.

29. The method of claim 19 including using simulated data to obtain the excitation coefficients.

30. The method of claim 19 including using a least-squares solution to obtain the excitation coefficients.

31. The method of claim 19 including applying time-varying excitation coefficients to create faded channel conditions in the region.

32. The method of claim 19 including utilizing a channel emulator to produce wireless test conditions.

33. The method of claim 32 including the channel emulator utilizing a 2D channel model.

34. The method of claim 32 including the channel emulator utilizing a multi-cluster channel model.

35. The method of claim 32 including the channel emulator utilizing a single-cluster channel model.

36. The method of claim 32 including the channel emulator utilizing an isotropic channel model.

37. A computer program stored on a non-transitory computer-readable medium, the program comprising:

logic which calculates excitation coefficients which are applied to at least one signal provided to a plurality of antennas disposed in relation to a region of space such that the region is in a near field of the plurality of antennas to approximate a single plane wave in the region, and applies the excitation coefficients to at least one signal transmitted via the antennas to generate the approximated single plane wave in the region.

38. The program of claim 37 wherein the antennas are disposed on a closed surface.

39. The program of claim 37 including an anechoic chamber in which the region and antennas are located.

40. The program of claim 37 wherein the antennas are disposed along an arc.

41. The program of claim 37 wherein the antennas are disposed along a ring.

42. The program of claim 37 wherein the antennas include a set of dipoles.

43. The program of claim 37 wherein the logic calculates multiple sets of excitation coefficients to sequentially produce plane waves from a plurality of directions.

44. The program of claim 43 further comprising logic which evaluates total isotropic sensitivity of a device under test disposed in the region.

45. The program of claim 37 wherein the logic adjusts the excitation coefficients to approximate a preselected superposition of plane waves which is then generated.

46. The program of claim 37 wherein the logic uses measured data to calculate the excitation coefficients.

47. The program of claim 37 wherein the logic uses simulated data to obtain the excitation coefficients.

48. The program of claim 37 wherein the logic uses a least-squares solution to obtain the excitation coefficients.

49. The program of claim 37 wherein the logic calculates time-varying excitation coefficients to create faded channel conditions in the region.

50. The program of claim 37 further comprising a channel emulator.

51. The program of claim 50 wherein the channel emulator utilizes a 2D channel model.

52. The program of claim 50 wherein the channel emulator utilizes a multi-cluster channel model.

53. The program of claim 50 wherein the channel emulator utilizes a single-cluster channel model.

54. The program of claim 50 wherein the channel emulator utilizes an isotropic channel model.

* * * * *